United States Patent

Johnson, Jr. et al.

[11] Patent Number: 5,861,790
[45] Date of Patent: Jan. 19, 1999

[54] STACKABLE AND COST-REDUCED TRANSFORMER WITH EMBEDDED EMI FILTERS

[75] Inventors: David Wilfred Johnson, Jr., Bedminster, N.J.; David A. Norte, Westminster, Colo.; John Thomson, Jr., Spring Lake, N.J.

[73] Assignee: Lucent Technologies Inc., Murray Hill, N.J.

[21] Appl. No.: 820,325

[22] Filed: Mar. 12, 1997

[51] Int. Cl.$^6$ .............................. H01F 5/00; H01F 27/28
[52] U.S. Cl. .......................... 336/200; 336/232; 336/223
[58] Field of Search .................................. 336/200, 223, 336/232, 192

[56] References Cited

U.S. PATENT DOCUMENTS

| | | | |
|---|---|---|---|
| 4,117,588 | 10/1978 | Johnson | 29/608 |
| 4,758,808 | 7/1988 | Sasaki et al. | 336/232 |

FOREIGN PATENT DOCUMENTS

| | | | |
|---|---|---|---|
| 01094607 | 4/1989 | Japan | H01F 27/28 |
| 6-176937 | 6/1994 | Japan | 336/200 |
| 08306559 | 11/1996 | Japan | H01F 37/00 |

*Primary Examiner*—Michael L. Gellner
*Assistant Examiner*—Anh Mai
*Attorney, Agent, or Firm*—David Volejnicek

[57] ABSTRACT

A transformer (FIG. 1) optimized for surface-mount vacuum-pickup automated circuit assembly eliminates the expense of a transformer housing. The transformer has a ferrite body (100) that defines a pair of wells (208, 209) each opening onto an opposite face (108, 109) of the ferrite body. Transformer primary and secondary windings are wound in a coil (103) through slots (210, 211) around a transformer core (204) at the bottom of the wells. The windings do not protrude from the wells beyond the faces, resulting in flat faces. A first plurality of conductive vias (104–106), one pair for each winding, are completely embedded in the ferrite body and extend to both of the faces. Each pair of vias serves at one face to attach to the winding and at the other face to attach to solder pods of a PC board. The embedded vias also serve as EMI filters. A plate (107) covers the one face and provides a surface for vacuum pickup and for labeling of the transformer. The ferrite body (500) of a first transformer (FIG. 5) adapted for stacked mounting of transformers dispenses with the flat plate and further defines a second plurality of pairs of conductive vias (104–106). These vias are not connected to the first transformer's windings, but rather are positioned for connection to the winding-connected first pairs of vias of a second transformer that is positioned orthogonally to and mounted on the first transformer at the one of the faces.

10 Claims, 3 Drawing Sheets

STACKABLE AND COST-REDUCED TRANSFORMER WITH EMBEDDED EMI FILTERS

CROSS-REFERENCE TO RELATED APPLICATIONS

This application relates to an application by the same inventors entitled "Stackable, Passively-Tunable, Cost-Reduced Inductor" Ser. No. 08/815,618 filed on Mar. 12, 1997, herewith and assigned to the same assignee.

TECHNICAL FIELD

This invention relates generally to the configuration of components adapted for printed circuit (PC) board assembly, and specifically to transformers adapted for surface-mount automatic PC board assembly.

BACKGROUND OF THE INVENTION

An electrical transformer typically comprises two "E"-shaped ferrite structures and a set of coiled wires (e.g., one primary coil and at least one secondary coil). The sets of coils are wound around the center leg of one of the E-shaped structures, after which the two E-shaped ferrite structures are bonded together to form the transformer. For use on printed circuit boards, the transformer primary and secondary coils are accessed from the printed circuit board by having their leads soldered onto metallic pins that are molded into a plastic housing. The plastic housing is then attached to the completed ferrite structure by some type of adhesive to form the final component package. Presently, the housing costs incurred in order to make the transformer surface-mountable is more than twice the cost of the two E-shaped ferrite cores comprising the transformer itself. A technological challenge is to configure the transformer such that the packaging costs are minimized while maintaining the PC-mountability of the transformer itself.

SUMMARY OF THE INVENTION

This invention is directed to meeting these and other needs of the prior art. According to the invention, a transformer dispenses with a housing. The transformer comprises a ferrite body defining a pair of slots extending through the ferrite body and a transformer core inbetween the slots. The transformer windings are wound through the slots and around the transformer core. Significantly, the ferrite body further defines a plurality of conductive vias that extend to a face of the ferrite body, and each winding is connected to a different pair of the vias. The vias serve, at the face of the ferrite body, to connect and mount the transformer to a circuit board. Since the ferrite body itself defines the connectors to the windings and the circuit board, a transformer housing is not needed for this purpose. The need for the housing is thus eliminated, and with it much of the transformer cost. Also, the vias are preferably completely embedded into the ferrite body, whereby they serve as effective EMI filters to eliminate any high-frequency noise signals superimposed onto the transformed signal.

Preferably, the ferrite body further defines a well having the transformer core at its bottom and opening onto the face, and the windings are wound around the transformer core through the well such that the windings do not protrude from the well beyond the face. Therefore, the face is flat and facilitates surface mounting of the transformer at the face to a circuit board by means of the conductive vias.

Preferably, the ferrite body defines not one but two wells each having the transformer core at its bottom and opening onto a different one of a first said face and an opposite second face of the ferrite body. The windings are wound around the transformer core through the wells such that the windings do not protrude from the wells beyond the faces. Thus, the transformer has two flat faces. When covered with a flat plate of material, such as a paper label, that is adhered to the second face over the well, the second face provides a surface for vacuum pickup and placement of the transformer by automated circuit assembly machines, and for labeling the transformer. The vias extend to both of the faces, and serve at the second face to connect to the windings. So that the connections do not protrude from the well beyond the second face, the ferrite body defines, at the second face at each of the vias, a notch opening onto the well, and the windings connect to the vias through the notches. The vias are preferably completely embedded in the ferrite body, so that they also serve as effective high-frequency noise EMI filters.

Further preferably, the transformer is configured to enable stacked mounting of at least two such transformers. The transformer comprises the ferrite body which defines a pair of wells each opening onto an opposite face of the ferrite body, a pair of slots extending through the ferrite body between bottoms of the wells, and a transformer core inbetween the slots at the bottoms of the wells. The windings of the transformer are wound through the slots and the wells around the transformer core such that the windings do not protrude from the wells beyond the faces. The ferite body also defines a first plurality of pairs of conductive vias, one pair for each said winding, embedded in the ferrite body and extending to both of the faces of the ferrite body. Each pair of vias is connected to a corresponding one of the windings. The ferrite body further defines a second plurality of pairs of conductive vias embedded in the ferrite body and extending to both of the faces of the ferrite body. Each pair of the second plurality of vias is for connection to a pair of vias of a second transformer that are connected to the windings of the second transformer, which transformer is mounted to the first transformer at one of the faces, and is preferably positioned orthogonally to the first transformer. These embedded vias also serve as effective EMI filters. By stacking transformers on a printer circuit board, valuable PC board real estate is conserved.

These and other advantages and features of the invention will become more apparent from the following description of an illustrative embodiment of the invention taken together with the drawing.

DETAILED DESCRIPTION

Figure 1:
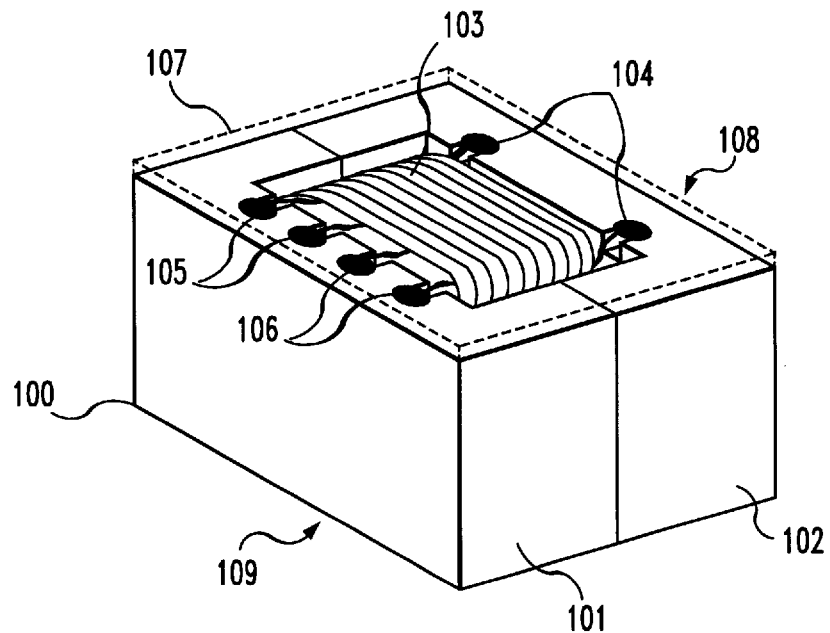
FIG. 1 is perspective view of a first transformer implementing an illustrative embodiment of the invention.
Figure 2:
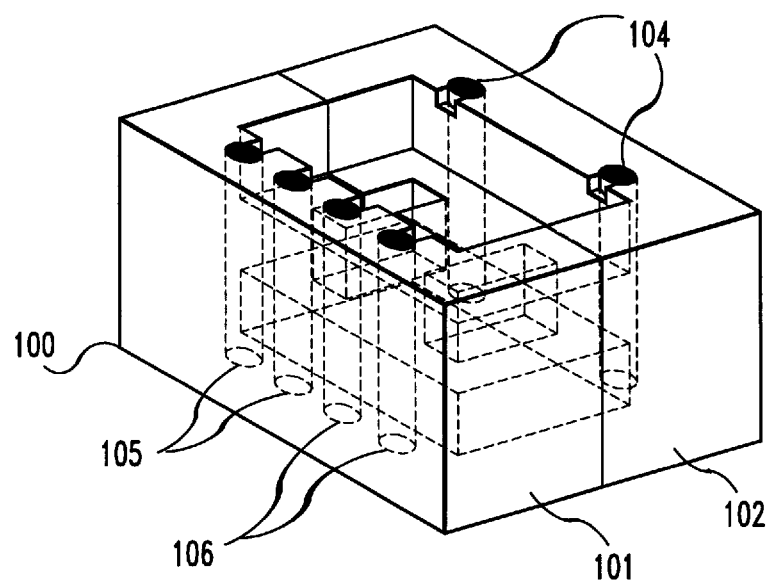
FIG. 2 is a perspective view of the ferrite body of the transformer of FIG. 1.
Figure 3:
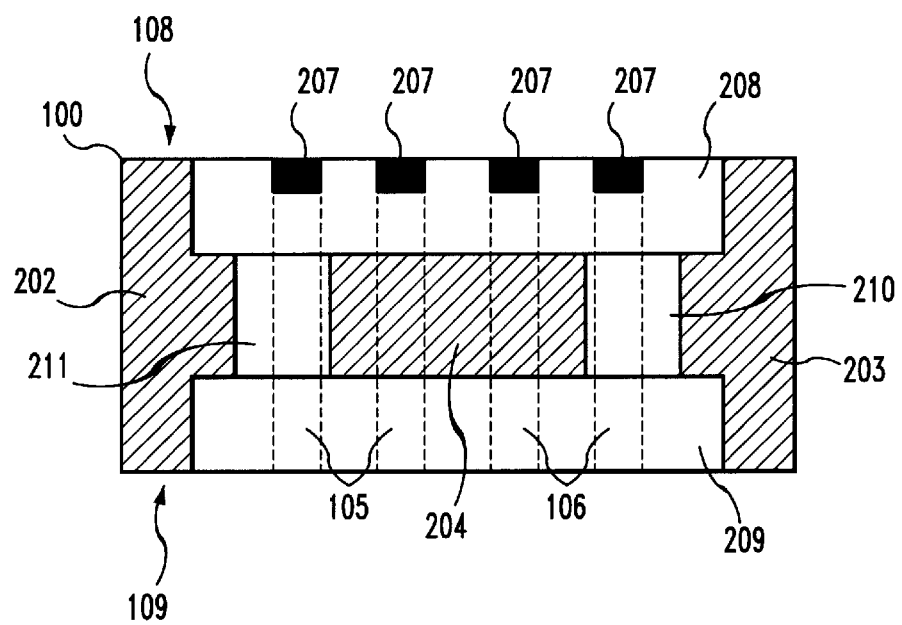
FIG. 3 is a front view of one of two substantially symmetrical halves of the ferrite body of FIG. 2.
Figure 4:
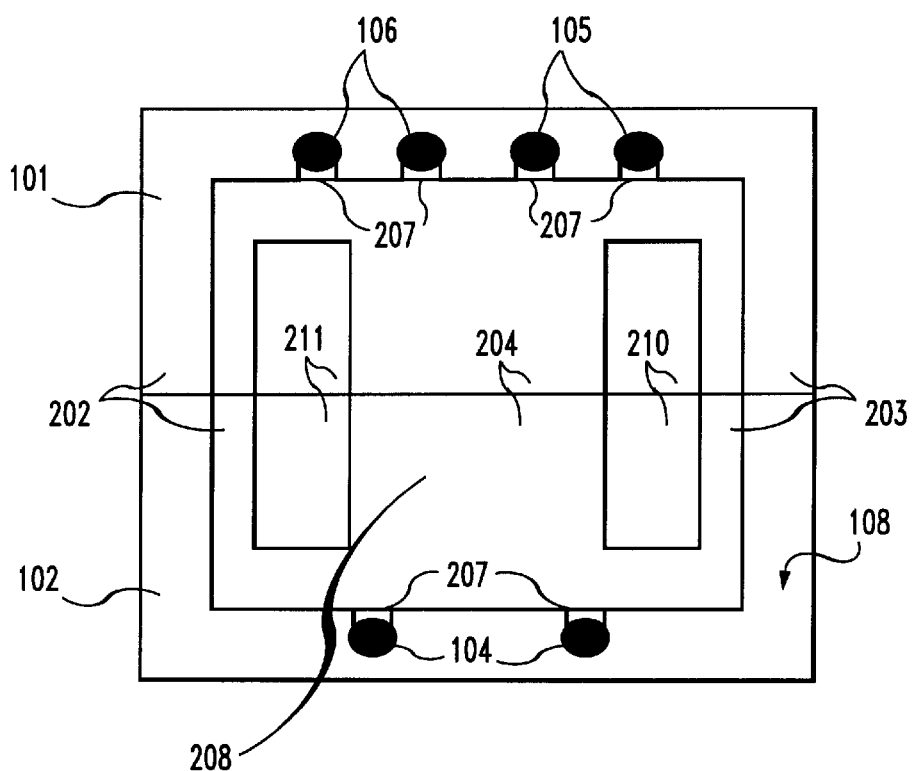
FIG. 4 is top view of the ferrite body of FIG. 2.

FIG. 1 shows a transformer constructed according to the principles of the invention. The transformer comprises a ferrite body 100 made of any suitable ferrite material— either conductive or non-conductive—such as nickel-zinc (NiZn), which surrounds a coil 103 of primary and secondary transformer windings. FIG. 2 shows a perspective view of the ferrite body 100 without coil 103 of windings, while FIGS. 3 and 4 show a cross-sectional view and a top view thereof, respectively. Ferrite body 100 defines a rectangular figure-8 shape that has a pair of openings or slots 210 and 211 therethrough. Between slots 210 and 211 lies a transformer central core 204. Coil 103 is wound through slots 210 and 211 around core 204. Ferrite body 100 defines a pair of wells 208 and 209, that face outwardly from ferrite body 100 through opposite faces 108 and 109 thereof and that have central core 204 at their bottoms. Wells 208 and 209 contain coil 103. Ferrite body 100 and wells 208 and 209 are dimensioned such that coil 103 does not protrude out of wells 208 and 209 beyond faces 108 and 109 of ferrite body 100 resulting in flat faces 108 and 109. Ferrite body 100 is preferably constructed from two body portions 101 and 102 for ease of transformer assembly. The windings of coil 103 are wound around central core 204 of one of the body portions 101 and 102 and then the two body portions 101 and 102 are bonded together. Body portions 101 and 102 may be, but need not be, symmetrical. For example, instead of each body portion 101 and 102 defining one half of central core 204 and outside legs 202 and 203, elements 202–204 may be defined entirely by only one of body portions 101 and 102. Ferrite body 100 defines a pair of transformer primary winding posts 104 and at least one pair of transformer secondary winding posts 105–106. Typically, there are as many pairs of secondary winding posts 105–106 as there are secondary windings in the transformer. Posts 104–106 are embedded in ferrite body 100. Each post 104–106 comprises a hole or a channel —a via—through ferrite body 100 which is metallized or filled in by conductive material. If ferrite body 100 is conductive, each post's conductive material is insulated from ferrite body 100 by a dielectric material. The ends of transformer windings that make up coil 103 are connected to posts 104–106 in a conventional manner, e.g., by solder. To ensure that even the connections of the ends of the windings to posts 104–106 do not protrude from well 208, ferrite body 100 defines notches 207 that extend between well 208 and posts 104–106, through which notches 207 the winding ends can be extended to posts 104–106. Thus, both faces 108 and 109 of the transformer are flat.

Posts 104–106 extend to, and even with, face 108. This makes the transformer well suited for surface-mount printed-circuit (PC) board assembly. The transformer is simply placed over a pattern of solder pods on the PC board, which pods are positioned to contact the ends of posts 104–106, and the solder is reflowed, thereby both mounting and electrically connecting the transformer to the PC board. The transformer requires no housing or other special elements for being mounted and/or connected to the PC board. Alternatively, posts 104–106 may extend beyond face 108 of the transformer, and their protruding portions may be inserted and soldered into holes in a PC board.

Face 108 of the transformer is covered by a flat plate 107 of material, such as plastic or paper, which is adhered to ferrite body 100 and covers well 208. Plate 107 provides a flat surface by means of which the transformer can be picked up and placed on a PC board by vacuum pickup and placement automated PC assembly machines. This makes the transformer suited for automated PC assembly. Additionally plate 107 provides a surface for labeling of the transformer.

Figure 5:
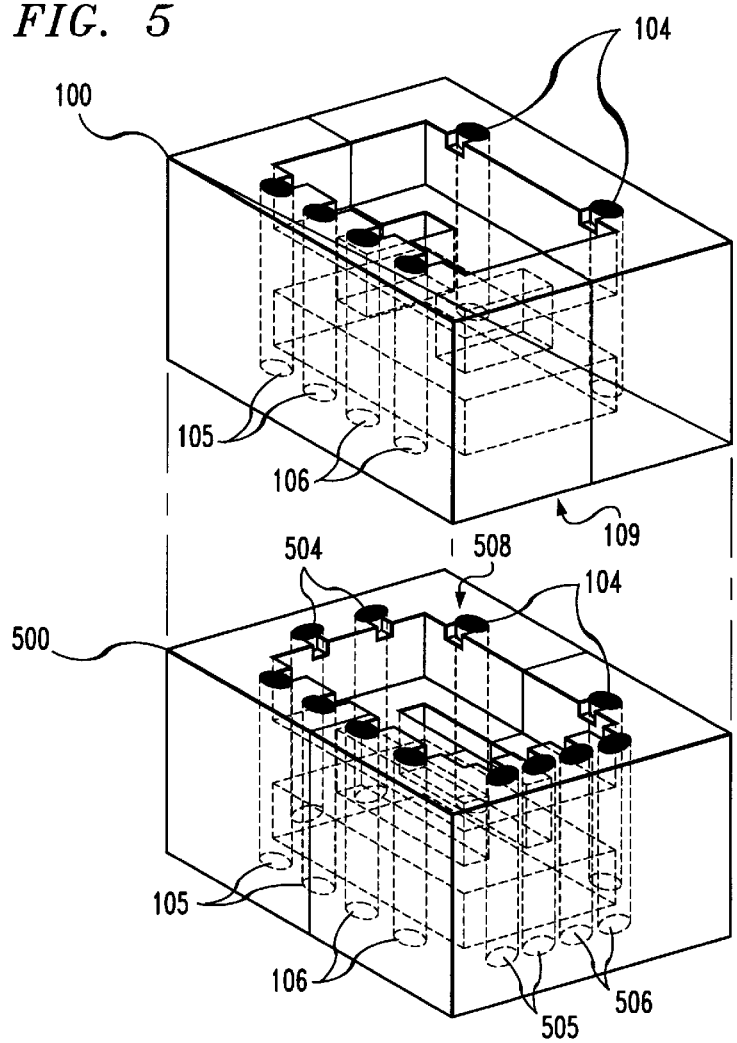
FIG. 5 is an exploded view showing how the transformer of FIG. 1 stacks with another transformer.

The above-described design of the transformer enables multiple ones of the transformers to be stacked on a PC board, thereby conserving PC board "real estate". This is illustrated in FIG. 5, which shows an exploded view of ferrite bodies 100 and 500 of two stacked transformers. Body 100 has been described above. Body 500 is the same as body 100, but in addition to its own transformer winding posts 504–506, it also defines duplicates of the winding posts 104–106 of body 100 of the other transformer. Preferably, both bodies 100 are of the same size and both are square. Posts 104–106 in body 500 are positioned such that when body 100 is positioned face 109-to-face 508 with and orthogonally to body 500, posts 104–106 of body 100 contact posts 104–106 of body 500. Thus, when posts 104–106 and 504–506 of body 500 are soldered or epoxied with conductive epoxy to a PC board, posts 104–106 of body 100 make electrical contact with the PC board through posts 104–106 of body 500.

When posts 104–106 of body 100 are soldered or epoxied to posts 104–106 of body 500, the joint creates a slight separation—an air gap—between bodies 100 and 500. This serves to prevent electrical cross-coupling (cross-talk) between the two transformers. However, the principal means of eliminating cross-coupling between the two transformers is their orthogonality, whereby the windings of coil 103 of the one transformer lie in a plane that is perpendicular to a plane in which lie the windings of the other transformer.

Figure 6:
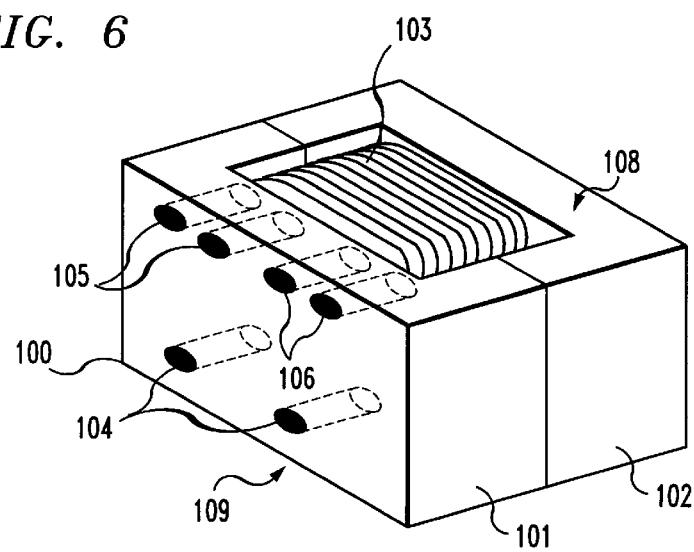
FIG. 6 is a perspective view of a second transformer implementing an illustrative embodiment of the invention.

Of course, various changes and modifications to the illustrative embodiment described above will be apparent to those skilled in the art. For example, the orientation of posts 104–106 relative to wells 208-209 and coil 103 may be changed, illustratively as shown in FIG. 6. Or, posts 104–106 need not be completely embedded in the transformer body (but then their functioning as EMI filters is lost). Such changes and modifications can be made without departing from the spirit and the scope of the invention and without diminishing its attendant advantages. It is therefore intended that such changes and modifications be covered by the following claims.

The invention claimed is:

1. A transformer comprising:
 a ferrite body defining a pair of slots extending through the ferrite body and a transformer core inbetween the slots;
 a primary winding and a secondary winding, both wound through the slots around the transformer core; and
 the ferrite body further defining a plurality of conductive vias extending to a face of the ferrite body, each winding being connected to a different pair of the vias;
 wherein the vias serve, at the face of the ferrite body, to connect and mount the transformer to a circuit board.

2. The transformer of claim 1 wherein:
 the ferrite body further defines a well having the transformer core at its bottom and opening onto the face; and
 the windings are wound around the transformer core through the well such that the windings do not protrude from the well beyond the face.

3. The transformer of claim 1 wherein:
 the ferrite body further defines a pair of wells each having the transformer core at its bottom and opening onto a different one of a first said face and a second face of the ferrite body opposite the first face;
 the windings are wound around the transformer core through the wells such that the windings do not protrude from the wells beyond the faces; and
 the plurality of vias extend to both said faces;
 wherein the vias serve, substantially at the second face, to connect to the windings.

4. The transformer of claim 3 wherein:

the ferrite body further defines, at the second face at each of the vias, a notch opening onto one of the wells; and each winding connects to its corresponding pair of vias through a pair of the notches;

wherein neither the windings nor their connections to the vias protrude from the wells beyond the faces.

5. The transformer of claim 4 further comprising:

a flat plate of material adhered to the ferrite body at the second face and covering the one of the wells;

wherein the flat plate provides a surface for at least one of vacuum pickup of the transformer and labeling the transformer.

6. The transformer of claim 1 wherein:

the vias are embedded in the ferrite body;

whereby the vias function as high-frequency filters.

7. A stackable first transformer comprising:

a ferrite body defining a pair of wells each opening onto an opposite face of the ferrite body, a pair of slots extending through the ferrite body between bottoms of the wells, and a transformer core inbetween the slots at the bottoms of the wells;

a primary winding and a secondary winding, both wound through the slots and the wells around the transformer core such that the windings do not protrude from the wells beyond the faces; and the ferrite body further defining a first plurality of pairs of conductive vias, one pair for each said winding, at least partially embedded in the ferrite body and extending to both said faces of the ferrite body, each said pair of vias being connected to a corresponding one of the windings, and a second plurality of pairs of conductive vias at least partially embedded in the ferrite body and extending to both said faces of the ferrite body, each said pair of the second plurality being for connection to a pair of vias connected to windings of a second transformer mounted to the first transformer at one of the faces.

8. The stackable transformer of claim 7 wherein:

each said pair of the second plurality is positioned for connection to the pair of vias connected to windings of the second transformer positioned orthogonally to the first transformer and mounted to the first transformer at the one of the faces.

9. The stackable first transformer of claim 7 wherein:

the ferrite body further defines, at the one face at each of the vias of the first plurality, a notch opening onto one of the wells; and each winding connects to its corresponding pair of vias of the first plurality through a pair of the notches;

wherein neither the windings nor their connections to the vias of the first plurality protrude from the well beyond the one face.

10. The stackable transformer of claim 7 wherein:

the vias of the first and the second pluralities are completely embedded in the ferrite body;

whereby the vias function as high-frequency filters.

* * * * *